(12) United States Patent
Furuta et al.

(10) Patent No.: US 8,884,493 B2
(45) Date of Patent: Nov. 11, 2014

(54) VIBRATION GENERATING DEVICE, DRIVING METHOD THEREFOR, FOREIGN SUBSTANCE REMOVING DEVICE, AND OPTICAL DEVICE

(75) Inventors: Tatsuo Furuta, Machida (JP); Kenichi Takeda, Yokohama (JP); Toshihiro Ifuku, Yokohama (JP); Makoto Kubota, Yokohama (JP); Hiroshi Saito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 171 days.

(21) Appl. No.: 13/176,649

(22) Filed: Jul. 5, 2011

(65) Prior Publication Data

US 2012/0032557 A1 Feb. 9, 2012

(30) Foreign Application Priority Data

Aug. 6, 2010 (JP) ................................. 2010-177526

(51) Int. Cl.
| | |
|---|---|
| *H01L 41/09* | (2006.01) |
| *H01L 41/187* | (2006.01) |
| *H02N 2/00* | (2006.01) |
| *G02B 27/00* | (2006.01) |
| *B08B 7/02* | (2006.01) |
| *B06B 1/02* | (2006.01) |
| *H01L 41/43* | (2013.01) |

(52) U.S. Cl.
CPC .............. *H02N 2/008* (2013.01); *H01L 41/187* (2013.01); *G02B 27/0006* (2013.01); *G03B 2205/0061* (2013.01); *H01L 41/43* (2013.01); *B08B 7/02* (2013.01); *B06B 1/0284* (2013.01)
USPC ....................................................... 310/317

(58) Field of Classification Search
USPC ........................................................ 310/317
See application file for complete search history.

(56) References Cited

U.S. PATENT DOCUMENTS

| 8,063,973 | B2 | 11/2011 | Niwamae | |
| 8,125,120 | B2 * | 2/2012 | Okazaki | 310/317 |
| 8,310,131 | B2 * | 11/2012 | Goodson | 310/317 |

FOREIGN PATENT DOCUMENTS

| JP | 63-249477 A | 10/1988 |
| JP | 2008-206013 A | 9/2008 |
| JP | 2009-10736 A | 1/2009 |
| JP | 2009-182828 A | 8/2009 |
| JP | 2009-261173 A | 11/2009 |

OTHER PUBLICATIONS

Japanese Office Action dated Apr. 22, 2014 in corresponding Japanese Patent Application No. 2010-177526.

* cited by examiner

*Primary Examiner* — Derek Rosenau
(74) *Attorney, Agent, or Firm* — Fitzpatrick, Cella, Harper & Scinto

(57) ABSTRACT

Provided is a vibration generating device in which more improvement of drive efficiency can be realized than conventional ones. The vibration generating device includes: a piezoelectric element including a piezoelectric material interposed between electrodes; a vibration member; a power source for applying an alternating voltage to the piezoelectric element; and a control section for controlling a frequency of the alternating voltage applied by the power source, in which the control section controls the frequency of the alternating voltage applied to the piezoelectric element so that the resonance frequency of the piezoelectric element is successively changed from low frequency side to high frequency side in a frequency range including a change range of a resonance frequency of the piezoelectric element.

5 Claims, 3 Drawing Sheets

9TH VIBRATION MODE

8TH VIBRATION MODE

VIBRATION GENERATING DEVICE, DRIVING METHOD THEREFOR, FOREIGN SUBSTANCE REMOVING DEVICE, AND OPTICAL DEVICE

BACKGROUND OF THE INVENTION

1. Field of the Invention

The present invention relates to a vibration generating device, a driving method therefor, a foreign substance removing device, and an optical device. In particular, the present invention relates to a technology that can be applied to various resonant devices of an inkjet head, an oscillatory wave motor, and the like, or a foreign substance removing device for removing foreign substances by vibration, which adhere to a surface of an image pickup apparatus, an optical device, or the like.

2. Description of the Related Art

Piezoelectric materials that can perform bidirectional conversion between electrical energy and mechanical energy are used as various devices for a sonar, a sensor, a speaker, and the like.

Among them, a vibration generating device, which induces vibration in a vibration member using an electrical-mechanical energy conversion element so as to generate a large vibration by resonance at one or more natural frequencies, is used for various resonant devices, a foreign substance removing device, and the like.

For instance, the vibration generating device is used as a resonant device of an inkjet head or an oscillatory wave motor that drives a moving body by vibration induced by the vibration member.

In addition, the vibration generating device is used for a foreign substance removing device for removing foreign substances by vibration, such as dust, dirt, or water droplets that adhere to a surface of an optical component incorporated in an image pickup device such as a digital camera or an optical device, and obstruct an optical path thereof.

A case where the vibration generating device is used in an inkjet head is described as follows. The inkjet head includes a plurality of nozzles constituted of the following members.

Specifically, the nozzle of the inkjet head includes an ink ejection port, an ink chamber filled with ink, a nozzle communicating hole that communicates between the ink chamber and the ejection port, and a vibration member to which a piezoelectric element with electrodes is bonded, and a plurality of such nozzles are disposed.

Further, when a voltage is applied to the piezoelectric element, stress is generated in the piezoelectric element, which causes a pressure change in the ink chamber so that the ink is ejected from the ejection port.

In addition, in the foreign substance removing device for removing foreign substances by vibration, which adhere to a surface of a digital camera or the like, a voltage is applied to the piezoelectric element fixed to the vibration member so as to drive the piezoelectric element for generating elastic vibration that moves the vibration member in the optical axis direction, namely in the thickness direction of the vibration member (hereinafter, referred to as out-of-plane vibration or flexural vibration).

The foreign substance removing device has a structure for removing foreign substances adhered to a surface of the vibration member by the flexural vibration.

In addition, the oscillatory wave motor is also used for driving a camera lens, for example.

Such oscillatory wave motor has a structure in which an alternating voltage is applied to a stator constituted of an electrode and a piezoelectric material that are joined together on the lower surface of the metal vibration member, and a rotor contacted to the upper surface of the stator with friction is driven to rotate by vibration generated in the vibration member.

An amount of static displacement and a displacement rate generated by the piezoelectric adverse effect in the vibration generating device are small, and hence a large voltage is required for generating a desired amount of displacement and displacement rate.

In order to obtain a large voltage, there is known a method of driving by setting a drive frequency to be the same or substantially the same as the natural frequency of the piezoelectric element.

In this way, a resonance phenomenon is generated and enables to generate a large amount of displacement and a high displacement rate in the vibration member even by a low voltage. Thus, drive efficiency can be improved.

The vibration generating device utilizing a resonance phenomenon as described above is called a resonant device. When the resonant device is driven, it is preferred to always drive at the resonance frequency or at a frequency close thereto in a viewpoint of drive efficiency.

However, the resonance frequency varies due to a change in environmental temperature or in a load.

Therefore, it is difficult to always drive by resonance at a constant frequency despite of a change in environment.

For this reason, Japanese Patent Application Laid-Open No. S63-249477 proposes an oscillatory wave motor driving device in which means for sweeping a certain frequency region is used for securely capturing the resonance frequency in driving, so as to securely realize driving at the resonance frequency and to perform stable driving.

In the structure described in Japanese Patent Application Laid-Open No. S63-249477, the drive frequency is swept from high frequency to low frequency so that the drive efficiency at high speed is improved.

In addition, Japanese Patent Application Laid-Open No. 2008-206013 proposes a dust removing device in which a piezoelectric element of vibration generating means for generating vibration in a dust-proof member for preventing dust from adhering to the image sensor is constituted of a piezoelectric ceramic.

Further, Japanese Patent Application Laid-Open No. 2008-206013 discloses that it is conventionally known to use lead titanate zirconate (PZT or $PbZr_{1-x}Ti_xO_3$) as a material of the piezoelectric ceramic constituting the piezoelectric element.

Further, because of the global warming problem caused by $CO_2$ or the surging oil price in recent years, it is demanded to improve efficiency in various devices.

Therefore, the above-mentioned vibration generating device and resonant device for the inkjet head, the foreign substance removing device, the oscillatory wave motor, or the like are required to have higher performance at lower cost. In the above-mentioned conventional example described in Japanese Patent Application Laid-Open No. S63-249477, the drive efficiency is improved by sweeping from high frequency to low frequency, but no specific composition of the piezoelectric material is disclosed for forming the piezoelectric element.

According to our study, the drive efficiency is not always improved by sweeping the drive frequency from high frequency to low frequency, depending on a type of the piezoelectric material. In order to respond to the above-mentioned requirement for high performance in recent years, more improvement is demanded in association with the piezoelectric material.

On the other hand, it is conventionally known to use lead titanate zirconate as the piezoelectric material for forming the piezoelectric material of the piezoelectric element, as described above. In particular, it is conventionally and generally known to use lead titanate zirconate that is designed to have high mechanical quality factor (Qm) for the resonant device.

However, if lead titanate zirconate is used as the piezoelectric material of the resonant device, there is the following problem.

In a resonant device, an amount of vibration displacement is determined by a ratio between vibration rate and drive frequency. In addition, the resonance frequency is determined by a ratio between Young's modulus and density.

Here, the density of lead titanate zirconate (measured by Archimedes' method) is approximately $7.5 \times 10^3$ kg/m$^3$ to $8.0 \times 10^3$ kg/m$^3$, which is high among piezoelectric materials, and the Young's modulus is approximately 60 to 80 GPa, which is smaller than other piezoelectric materials.

In other words, in the case of lead titanate zirconate, the resonance frequency is lower than other piezoelectric materials. As a result, even if the vibration is generated at the same vibration rate, the amount of vibration displacement after conversion is substantially small.

Therefore, the integrated displacement by the sweep is also small, and therefore there is a problem that the drive efficiency is low compared with other piezoelectric materials.

In view of the above-mentioned problem, an object of the present invention is to provide a vibration generating device, a driving method therefor, a foreign substance removing device, and an optical device, in which more improvement of drive efficiency can be realized than the case where the piezoelectric element is constituted of the conventional piezoelectric material of lead titanate zirconate.

SUMMARY OF THE INVENTION

The present invention provides a vibration generating device, a driving method therefor, a foreign substance removing device, and an optical device, which have the following structures.

According to the present invention, there is provided a vibration generating device including a piezoelectric material interposed between electrodes, the piezoelectric material having a resonance frequency that changes to higher frequency side when the alternating voltage is applied; a vibration member to which the piezoelectric element is connected; a power source for applying an alternating voltage to the piezoelectric element; and a control section for controlling a frequency of the alternating voltage applied by the power source, in which the vibration generating device generates vibration in the vibration member by applying the alternating voltage to the piezoelectric element from the power source, and in which the control section controls the frequency of the alternating voltage applied to the piezoelectric element so that the resonance frequency of the piezoelectric element is successively changed from low frequency side to high frequency side in a frequency range including a change range of a resonance frequency of the piezoelectric element.

In a method of driving the above-mentioned vibration generating device according to the present invention, a rate of changing frequency of the alternating voltage is set to be larger than a change rate of the resonance frequency of the piezoelectric element.

According to the present invention, there is provided a foreign substance removing device including the above-mentioned vibration generating device, in which the foreign substance removing device removes foreign substances by vibration generated by the vibration generating device.

According to the present invention, there is provided an optical device including the above-mentioned vibration generating device, in which the foreign substance removing device removes foreign substances on an optical path.

According to the present invention, there may be realized a vibration generating device, a driving method therefor, a foreign substance removing device, and an optical device, in which more improvement of drive efficiency can be realized than the case where the piezoelectric element is constituted of the conventional piezoelectric material of lead titanate zirconate.

Further features of the present invention will become apparent from the following description of exemplary embodiments with reference to the attached drawings.

DESCRIPTION OF THE EMBODIMENTS

Embodiments of the present invention will now be described in detail in accordance with the accompanying drawings.

Note that this embodiment describes a foreign substance removing device, but the present invention is not limited thereto.

For instance, the present invention can be applied to various apparatuses such as an oscillatory wave motor and an inkjet head, which uses a resonant device.

Next, as an example of this embodiment, a structural example of the foreign substance removing device is described with reference to FIG. 1.

Figure 1:
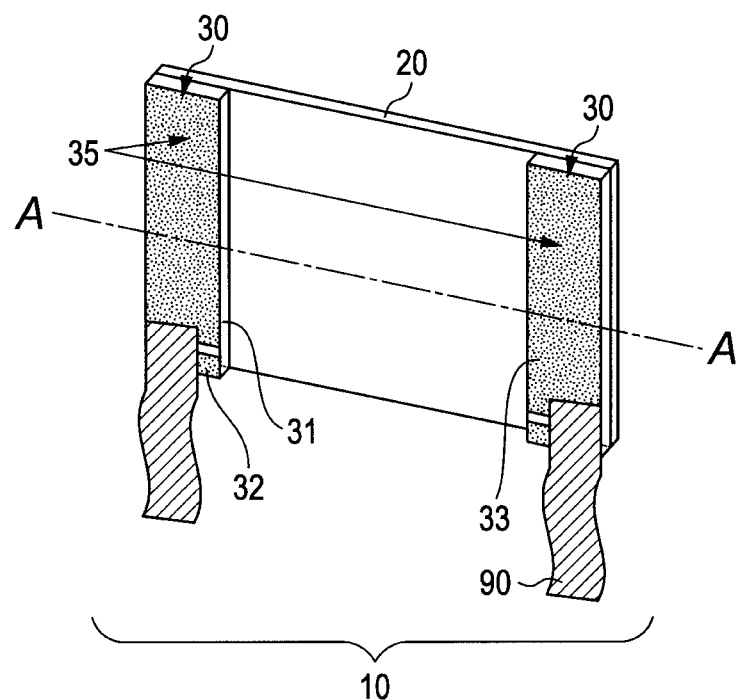
FIG. 1 is a diagram illustrating an example of an embodiment of the present invention, and is a schematic diagram illustrating a structure of a foreign substance removing device equipped with a vibration generating device according to the present invention.

FIG. 1 is a schematic diagram illustrating a structure of the foreign substance removing device equipped with a vibration generating device according to the present invention.

As illustrated in FIG. 1, a foreign substance removing device 10 of this embodiment includes a vibration member 20 and piezoelectric elements 30.

The vibration member 20 is constituted of a glass plate having a function as an infrared cut filter, which is a target for removing foreign substances adhered to the surface by vibration as in Example 1 to be described later.

The piezoelectric elements 30 each have a structure in which a piezoelectric material 31 is formed in a plate-like shape and interposed between a first electrode formed on one plate surface (rear side of the piezoelectric material 31) and a second electrode 33 formed on the other plate surface (front side of the piezoelectric material 31).

In this case, the piezoelectric element of this embodiment is constituted of the piezoelectric material in which the resonance frequency is shifted to high frequency side when the alternating voltage is applied. A specific example of the piezoelectric material will be described later.

Figure 2:
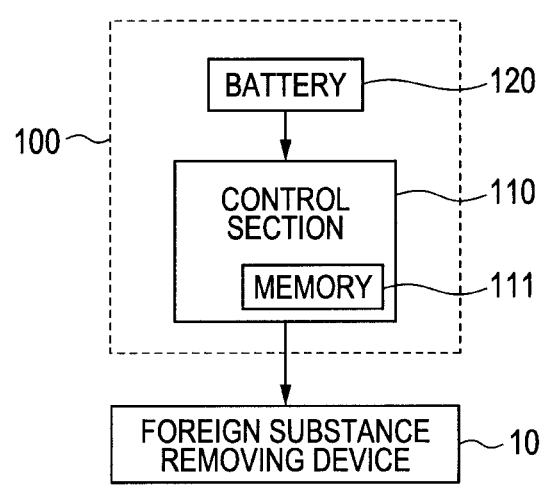
FIG. 2 is a block diagram illustrating a structure of the foreign substance removing device.

In addition, there are provided a flexible cable for supplying electric power to the piezoelectric elements 30, and a driving circuit including a power source unit 100 that can output alternating voltage while changing the frequency successively (FIG. 2).

With reference to the block diagram illustrated in FIG. 2, the structure of the foreign substance removing device according to the present invention is described. The power source unit 100 includes a control section 110 equipped with a memory 111, and a battery 120. The foreign substance removing device 10 is connected to the control section 110 in the power source unit 100 via the flexible cable 90.

This control section 110 has a structure for controlling frequency of the alternating voltage generated from the battery 120.

In other words, the control section has a structure in which frequency of the alternating voltage supplied to the piezoelectric elements 30 is controlled so that resonance frequency of the piezoelectric elements 30 is successively changed from low frequency side to high frequency side in a frequency range including the resonance frequency change range of the piezoelectric elements 30.

This frequency change range is determined by referring to information that is recorded in the memory 111 in advance.

Here, the alternating voltage means a voltage whose amplitude varies periodically over time, and may be a sine wave, a rectangular wave, or a triangular wave. In addition, an offset voltage may be added to the alternating voltage as a whole.

In addition, to successively change the frequency means that the frequency of the output alternating voltage starts from a low frequency and ends at a high frequency in a certain frequency region, and may include a step of returning to a low frequency from a high frequency in the process.

The first electrode 32 and the second electrode 33 are disposed to be opposed on plate surfaces of the piezoelectric material 31 in a plate-like shape. FIG. 1 illustrates the state where the edge of the first electrode is folded back from the opposite plate side of the piezoelectric material 31 on which the second electrode 33 is disposed to a second electrode surface 35 so as to be bonded to the electrode surface 35.

Here, the electrode surface means the surface of the piezoelectric material 31 on which the electrode is disposed.

In this way, because the first electrode 32 is folded back to the second electrode surface 35, it is possible to be bonded to the flexible cable 90 on a single surface.

The piezoelectric elements 30 each constituted of the piezoelectric material 31 interposed between electrodes are fixed and connected to both ends of the plate surface of the vibration member 20, for example, and the polarization direction of the piezoelectric elements 30 is the direction perpendicular to the plate surface.

Here, to be interposed means that there is at least a region to which the alternating voltage is applied in the piezoelectric element, and it does not concern whether or not there is a region to which the alternating voltage is not applied.

In the examples described below, all the piezoelectric elements 30 are polarized in the direction perpendicular to the plate surface, and an average of polarization vectors of the piezoelectric elements 30 is directed to the direction toward the vibration member. For instance, the power source unit incorporated in the digital camera body supplies electric power for sweeping the alternating voltage in a constant region of frequency range to the electrodes via the flexible cable 90. Then, the vibration member 20 is deformed by stress generated in the piezoelectric elements 30 so that flexural vibration is generated.

The foreign substance removing device 10 of the present invention drives the two piezoelectric elements 30 illustrated in FIG. 1 while changing a phase difference. Thus, vibrations having different vibration modes are periodically generated so that flexural vibration is generated in the entire plate surface. By this vibration, the device can remove foreign substances adhered to the surface of the vibration member 20.

Here, the vibration mode means a mode in which the vibration member resonates. A standing wave of a plurality of orders having a plurality of nodes and anti-nodes, or a carrier wave with nodes and anti-nodes that moves in the length direction of the vibration member with respect to time can be generated by the flexural vibration of the vibration member.

Next, with reference to FIG. 3, the vibrations of the foreign substance removing device equipped with the vibration generating device according to this embodiment is described.

Figure 3A:
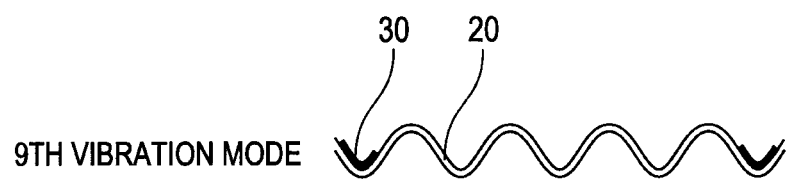
FIGS. 3A and 3B are diagrams illustrating vibrations of the foreign substance removing device equipped with the vibration generating device according to the embodiment of the present invention.
Figure 3B:

FIGS. 3A and 3B are schematic diagrams each illustrating the vibration state in the A-A section indicated by a dot and dash line in FIG. 1 (the electrodes and the flexible cable are not shown), and is a diagram illustrating a vibration principle of the foreign substance removing device 10.

FIG. 3A illustrates the state where the flexural vibration is generated in the vibration member 20 when alternating voltages having the same phase, namely having a phase difference of substantially zero degrees, are applied to a pair of left and right piezoelectric elements 30. The foreign substance removing device 10 is operating at a 9th vibration mode.

FIG. 3B illustrates the state in which the flexural vibration is generated in the vibration member 20 at an 8th vibration mode when alternating voltages having opposite phases, namely having a phase difference of substantially 180 degrees, are applied to the pair of left and right piezoelectric elements 30.

The foreign substance removing device 10 of this embodiment selectively uses the at least two vibration modes, with the result that foreign substances adhered to a surface of the vibration member can be removed more effectively.

However, the number of the vibration modes and the order used may be different depending on a purpose or a form of using the vibration generating device. For instance, when used for the inkjet head, the number of the vibration modes and the order should be selected so that desired ejection performance (ejection speed and ejection amount) can be realized.

In addition, when used for the oscillatory wave motor, the number of the vibration modes and the order should be selected so that desired rotation performance (torque and rotation speed) can be obtained.

In the piezoelectric elements 30 of this embodiment, the resonance frequency changes from low frequency to high frequency when the alternating voltage is applied.

In the foreign substance removing device 10 equipped with the piezoelectric elements 30, the resonance frequency changes from low frequency to high frequency.

In this case, the resonance frequency continues to change in the sweep direction even after the drive frequency becomes higher than the resonance frequency.

Therefore, attenuation of the amount of vibration displacement is decreased, and the integrated displacement is increased.

Here, the integrated displacement is obtained by temporally adding the amounts of vibration displacement that vary over time when the alternating voltage is changed from low frequency to high frequency.

Further, it is possible to sweep so that the drive frequency becomes the same as the resonance frequency when the alternating voltage is changed from low frequency to high frequency. In this case, a large amount of vibration displacement in the vicinity of the resonance frequency can be always obtained, and hence the integrated displacement is also increased.

Here, the frequency range of the sweep may include a plurality of resonance frequencies having vibration modes different from the above-mentioned vibration mode, and it is desired to select a frequency range in which the integrated displacement becomes the maximum, for example.

In general, in order to remove various sizes of foreign substances more, it is advantageous that an integrated vibration displacement in the sweep is large.

Here, when the alternating voltage is changed from low frequency to high frequency, the effect of the present invention can be obtained even if the step of returning to low frequency side is included in the process.

It is preferred to change to high frequency at a constant speed, and it is more preferred to temporarily stop or decrease the speed in the vicinity of the resonance frequency for a certain period of time.

Here, the frequency range of sweeping the drive frequency is set to 1 Hz or higher to $1 \times 10^6$ Hz or lower.

Further, when the frequencies in the vibration modes to be used are denoted by F1, F2, F3, . . . , Ft in the ascending order of frequency, it is preferred to sweep in the following frequency range.

Specifically, in the case of t=1, it is preferred to sweep in the frequency range of F1−F1÷2 or higher to F1+F1÷2 or lower.

In addition, in the case of t≠1, it is preferred to sweep in the frequency range of F1−(Ft−F1)÷t or higher to Ft+(Ft−F1)÷t or lower.

However, it is sufficient that the range include a range in which the resonance frequency of at least one vibration mode changes. In this range, drive efficiency is higher as the range is narrower.

Here, the range in which the resonance frequency changes is a range in which the resonance frequency changes when the drive is performed by the voltage to be actually used. The range is different depending on a form of use of the vibration generating device, and hence is obtained by measuring a vibration displacement while controlling the drive frequency with a laser Doppler vibrometer and a waveform generator in advance, for example.

As a piezoelectric material that can be used for the piezoelectric material 31 of the present invention, there are following piezoelectric materials.

For instance, there is a piezoelectric material containing, as a main component, one or more solid solutions selected from the group consisting of barium titanate, bismuth sodium titanate, bismuth potassium titanate, and potassium sodium niobate.

Such material has a larger ratio between Young's modulus and density than lead titanate zirconate. Therefore, the resonance frequency becomes high, with the result that a vibration rate in the resonance increases, and that a foreign substance removal ratio can be improved.

Here, it is more preferred that the Young's modulus become large so that the ratio between Young's modulus and density becomes large.

In general, a material having a large Young's modulus also has a large value of Qm, and hence the amount of vibration displacement and the displacement rate in resonance become large. As a result, the foreign substance removal ratio is further improved. It is more preferred that the Young's modulus be 100 GPa or larger to 150 GPa or smaller.

In addition, the density means an actual density measured by Archimedes' method, and a ratio to a theorical density is preferably 90.0% or larger to 99.9% or smaller, and is more preferably 95.0% or larger to 99.9% or smaller.

A piezoelectric material having a small ratio to the theorical density has a large void ratio. Therefore, a void part is largely deformed when the piezoelectric material is driven.

In this way, a stress difference generated in the piezoelectric element is absorbed so that a desired amount of vibration displacement cannot be obtained, and that high drive efficiency cannot be obtained.

Further, such material has a large impulse to be given to large foreign substances having a size of approximately 100 μm or larger, for example. Therefore, the substances can be easily removed.

Here, if the piezoelectric material contains the piezoelectric material as a main component, such as barium titanate that does not use lead, even if lead or an element constituting lead titanate zirconate is contained as a sub component, it is sufficient that the piezoelectric material have a resonance frequency that changes to high frequency side when the alternating voltage is applied.

It is preferred to use a piezoelectric material having a density after mixing that is smaller than that of lead titanate zirconate and a Young's modulus that is larger than that of lead titanate zirconate, which provides the same effect.

Currently, lead titanate zirconate containing lead or a piezoelectric material containing a large amount of lead is often used in the piezoelectric element that is used for various devices.

However, it is pointed out that if the piezoelectric element such as lead titanate zirconate containing a large amount of lead is once dumped and exposed to acid rain, the lead component in the piezoelectric material may be dissolved into soil and may cause bad influence to ecosystem.

Therefore, in order to care for the environment, it is preferred that the amount of Pb contained in the piezoelectric material used in the foreign substance removing device 10 of this embodiment be as little as possible.

For instance, it is preferred that the piezoelectric material constituting the piezoelectric material 31 be a piezoelectric ceramic whose main component is barium titanate or the like containing Pb at 1,000 ppm or lower. If the content of Pb is 1,000 ppm or lower, even if the foreign substance removing device is dumped and exposed to acid rain or to a severe environment, there is a low probability that the lead component in the piezoelectric material badly affects the environment.

In addition, it is desired to use such material as the piezoelectric material of the Young's modulus described above.

In addition, it is preferred that a change rate of the alternating voltage for driving the vibration generating device of this embodiment be faster than a change in the resonance frequency. When the sweep rate is faster than the change in the resonance frequency, driving at the resonance frequency can be securely performed. Therefore, it is possible to realize the driving method of driving the foreign substance removing device with the maximum amount of displacement.

Here, the change rate of the alternating voltage may be slower than the change rate of the resonance frequency for a certain period of time in the sweep, and it is sufficient if the frequency of the alternating voltage when the sweep is finished is higher than the resonance frequency.

Preferably, the range for the resonance frequency to vary in the sweep is $10^{-5}$ times the frequency range for the sweep or larger to one time the frequency range or smaller. More preferably, the range is $10^{-3}$ times the frequency range for the sweep or larger to one time the frequency range or smaller. Thus, it is possible to always drive in the vicinity of the resonance frequency, with the result that the integrated vibration amount is increased, and that the drive efficiency is improved.

Next, a method of manufacturing the foreign substance removing device 10 of this embodiment illustrated in FIG. 1 is described. The method of manufacturing the piezoelectric material 31 is not limited in particular, but an example thereof is described.

First, a sintering additive such as a dispersing agent is added to piezoelectric ceramic powder that has been adjusted to have a desired composition, which is press molded by the pressure necessary to make a high density sintered body, to thereby produce a piezoelectric ceramic compact.

Here, if sufficient pressure cannot be obtained only by press mold, a desired pressure may be added by cold isostatic press (CIP) or the like.

In addition, it is possible to make a piezoelectric ceramic compact ingot by the CIP or the like without using the press mold from the first stage.

Next, the piezoelectric ceramic compact is sintered to make a piezoelectric ceramic sintered body. An optimal sintering method should be selected for obtaining a desired piezoelectric ceramic. If necessary, the piezoelectric ceramic compact may be processed to be a desired shape before sintering.

Next, the produced piezoelectric ceramic sintered body is ground to be a desired size so that a piezoelectric ceramic (piezoelectric material) having a rectangular solid shape is produced.

After that, by baking of silver paste, Au sputtering, or Au plating, the first electrode 32 and the second electrode 33 are formed as illustrated in FIG. 1, so that the piezoelectric element is obtained.

Next, a polarization process is performed by applying an electric field of 0.5 to 5.0 kV/mm with a DC voltage in the air or in incombustible oil such as silicone oil for 5 minutes to 10 hours at a temperature below Curie temperature or depolarization temperature of the piezoelectric material 31.

As described above, it is preferred to perform the polarization process on the piezoelectric elements 30 of this embodiment in advance in the manufacturing process, but it is not essential.

Next, for example two piezoelectric elements 30 formed on the piezoelectric material 31 interposed between electrodes are prepared, and are fixed and connected to the vibration member 20 that is cut to be a desired size. The piezoelectric material 31 interposed between electrodes is adapted so that the first electrode surface (not shown) is disposed at an end portion of the plate surface of the vibration member 20.

The piezoelectric material and the vibration member can be fixed to each other with an epoxy resin adhesive, for example.

As the adhesive, it is preferred to select one that does not deteriorate its adhesive property at operating temperature of the foreign substance removing device 10 and the mechanical quality factor Qm of the foreign substance removing device 10.

In addition, because the polarization process has been performed on the piezoelectric elements 30, it is preferred that adhesion temperature thereof be below Curie temperature or depolarization temperature of the piezoelectric material 31.

Further, the flexible cable 90 is bonded to the second electrode surface 35 of the piezoelectric elements 30.

In this bonding process, registration is performed so that a ground wiring and a drive wiring of the flexible cable are connected independently to the first electrode and the second electrode. In this case, too, it is preferred that the adhesion temperature be lower than the Curie temperature or the depolarization temperature of the piezoelectric material 31.

It is not necessary to perform the above-mentioned polarization process, fixing process to the vibration member, and bonding process of the flexible cable in the above-mentioned order.

For instance, if the polarization process is performed at last, the fixing process to the vibration member and the bonding process of the flexible cable may be performed at the Curie temperature or the depolarization temperature of the piezoelectric material 31 or higher temperature.

By connecting the flexible cable to the driving circuit including the power source unit that can sweep frequency, the foreign substance removing device 10 can be manufactured.

Thus, the foreign substance removing device and the method of manufacturing the same according to the present invention are described above, but the present invention is not limited to this foreign substance removing device.

For instance, other than that, the present invention can be applied to any type of resonant device of an inkjet head, a video digital camera, a copying machine, a facsimile machine, a scanner, or the like. In addition, foreign substances are mainly solid substances, but the present invention can be also applied to removing, transferring, or transmitting means of liquid, vapor, or gas.

Hereinafter, examples are described to which the structure of the foreign substance removing device of the present invention is applied, but the present invention is not limited to the following examples.

Example 1

Example 1 describes a method of manufacturing a piezoelectric element using a piezoelectric material of simple substance of barium titanate as a main component.

In the example, a polyvinyl alcohol solution of a concentration of 5 mass % was added as a binder to mixture powder of barium titanate particles having an average particle diameter of 100 nm (BT-01 (registered trademark) produced by Sakai Chemical Industry Co., Ltd.) and manganese acetate (II), so as to produce a slurry.

The addition amount was set so that polyvinyl alcohol in the polyvinyl alcohol solution was 3 mass % with respect to the mixture powder.

Further, a dispersing agent (SN-dispersant 5020 (registered trademark) produced by San Nopco Ltd.) was added to this mixture solution, so as to have a concentration of 5 mass %.

From this mixture solution, particles were produced using a spray dryer apparatus. 1.6 G of the produced particle powder were filled in a mold having a size of 45.0×7.0 mm and were molded uniaxially by pressure of 200 MPa to form a compact.

Next, this compact was sintered in an electric furnace in air atmosphere at 1,380° C. for 2 hours. The temperature increasing rate was set to 10° C. per minute, and in the increasing process, the temperature was kept at 600° C. for 3 hours, so that the piezoelectric material using the compact was manufactured.

The obtained piezoelectric material had a size of 36.4 (one side)×5.75 (the other side)×1.6 (thickness) mm. The density thereof was measured by Archimedes' method, and the measured density was $5.9 \times 10^3$ kg/m$^3$. A relative density to the theorical density was 98%.

In addition, Young's modulus was 101 GPa.

Next, the piezoelectric material after the polarization process was ground to have a size of 36.4×5.75×0.25 mm.

Then, on the two surfaces of the piezoelectric material after the above-mentioned process having the size of 36.4×5.75 mm, Ti and Au layers were formed in this order by DC magnetron sputtering so as to have thicknesses of 30 nm and 380 nm, respectively, in patterns of a first electrode and a second electrode.

Next, this was cut to have a size of 33.3 (length)×4.0 (width)×0.25 (thickness) mm, to form the piezoelectric element.

Next, the polarization process was performed in silicone oil using a DC power source so that an electric field of 1 kV/mm was applied between the above-mentioned two surfaces in size of 33.3×4.0 mm of the above-mentioned piezoelectric element. The oil temperature was set to 100° C., the applied electric field was 1 kV/mm, and the voltage applying period was 30 minutes at 100° C.

Next, the rounding electrode was patterned and formed in order of Ti and Au by the above-mentioned DC magnetron sputtering to connect the first electrode on the first electrode surface and the second electrode on the second electrode surface via one surface of the piezoelectric element.

Here, the piezoelectric element was manufactured to have a width of 4.0 mm in this embodiment, but an optimal length depends on the vibration mode to be used and is preferably 70% to 90% of (distance between piezoelectric elements)×2÷(order of the vibration mode) in viewpoint of drive efficiency.

The piezoelectric element of this example was bonded to the glass plate having a function as an infrared cut filter in an optical device, to manufacture a foreign substance removing device for removing foreign substances on the optical path. Specifically, the piezoelectric element of this example was bonded to the glass plate having a size of 50 (one side)×33 (the other side)×1 (thickness) mm constituting the vibration member, along the side of 33 mm, with epoxy resin adhesive, to manufacture the foreign substance removing device in the optical device.

Next, in the manufactured foreign substance removing device, in order to know resonance frequencies generated in 8th and 9th vibration modes, variation of the impedance value was measured as follows.

Specifically, variation of the impedance value was measured by using an impedance analyzer when the frequency was changed at a low voltage of 0.5 V in the case of in-phase and in the case of anti-phase with respect to the first electrode and the second electrode.

In addition, in order to know the order of the vibration mode, measurement was performed by using a laser Doppler vibrometer (AT7200 manufactured by Graphtec Corporation) to count the number of anti-nodes at which the amount of vibration displacement becomes the maximum value or the minimum value while scanning in the longitudinal direction of the glass plate.

As a result, the impedance became minimum at a frequency of 35 kHz in the in-phase drive so that the 9th vibration mode appeared. In addition, in the anti-phase drive, the 8th vibration mode became minimum at a frequency of 30 kHz.

In addition, in order to set the sweep rate to be faster than a variation rate of the resonance frequency, the sweep rate was set to have a maximum value in every sweep both in the in-phase drive and in the anti-phase drive.

Because the drive frequency exceeds the resonance frequency, the amount of vibration displacement has a maximum value.

In this example, because the variation rate of the resonance frequency was 1 Hz/sec or higher to 1 kHz/sec or lower, the sweep rate was set to a constant rate of 10 kHz/sec both in the in-phase drive and in the anti-phase drive.

Here, in order to confirm the effect of the foreign substance removing device of this example, there were prepared polypropylene beads having three different diameters of 1 µm, 10 µm, and 100 µm similar to dust particles.

The three types of beads were all adhered to the glass plate, and sweep drive was performed. After that, the number of beads remaining on the glass plate was counted in the image taken by an optical microscope, to measure the removal ratio of beads.

On this occasion, in order to check the foreign substance removing performance in low voltage drive, the sweep drive was performed at a drive voltage that was 70% of the normal drive voltage.

The frequency range of the sweep was set to 10 kHz with a center frequency of {(frequency generated in the 8th vibration mode)+(frequency generated in the 9th vibration mode)}/2, and the sweep drive was repeated in in-phase and in anti-phase for a certain period of time.

In this case, using a laser Doppler displacement meter, the amount of vibration displacement at each frequency was measured when the sweep was performed in the in-phase drive at a point where the amount of vibration displacement became maximum near the middle of the glass plate.

Figure 4:
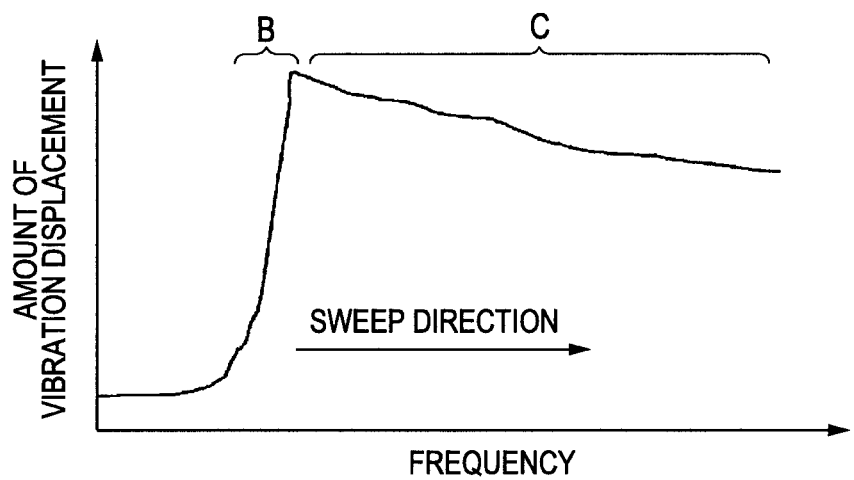
FIG. 4 is a graph illustrating vibrations at individual frequencies in the foreign substance removing device equipped with the vibration generating device according to Example 1 of the present invention.

A result of the measurement by the laser Doppler displacement meter is shown in FIG. 4.

As shown in FIG. 4, when the drive frequency was swept, the amount of vibration displacement was increased rapidly in the vicinity of the resonance frequency (in region B in the diagram).

In addition, beyond the resonance frequency, when the drive frequency was swept away from the resonance frequency to high frequency, the amount of vibration displacement was not decreased so much (in region C in the diagram). Therefore, it is understood that the integrated displacement of the amount of vibration displacement in the sweep is increased.

In addition, the amount of vibration displacement in the anti-phase drive had the same tendency. In addition, the range of variation of the resonance frequency in one sweep was $10^{-2}$ times the frequency range of the sweep.

As a result of measuring the removal ratio of beads, the removal ratio in this example was 96% for 1 µm beads, 98% for 10 µm beads, and 99% for 100 µm beads.

Example 2

Example 2 describes a method of manufacturing a piezoelectric element using a piezoelectric material of simple substance of bismuth sodium titanate as a main component.

In this example, a piezoelectric material expressed by 94(Bi, Na)TiO$_3$-6BaTiO$_3$ was produced.

Concerning other processes except the producing process of the piezoelectric material, the same processes as in Example 1 were used to manufacture the foreign substance removing device.

However, the powder of particles produced by spray dry was obtained by mixing $Bi_2O_3$, $Na_2CO_3$, $TiO_2$, and $BaCO_3$ at a desired composition ratio, and by calcining the mixture in an alumina crucible at 700° C. for 5 hours.

In addition, the resultant was sintered at a temperature of 1,050° C. for 2 hours, and in the process, kept at 200° C. for 10 hours.

The piezoelectric element having a size of 33.3×4.0×0.25 mm produced by the process described above was used for manufacturing the foreign substance removing device.

Density of the piezoelectric material of the sintered 94(Bi, Na)$TiO_3$-6$BaTiO_3$ was measured by Archimedes' method. Then, the density was $5.8 \times 10^3$ kg/m$^3$, and a relative density to the theorical density was 97%. In addition, Young's modulus was 122 GPa.

Next, in the manufactured foreign substance removing device, in order to know resonance frequencies generated in 8th and 9th vibration modes, variation of the impedance value was measured as follows.

Specifically, variation of the impedance value was measured by using an impedance analyzer when the frequency was changed at a low voltage of 0.5 V in the case of in-phase and in the case of anti-phase with respect to the first electrode and the second electrode.

In addition, in order to know the order of the vibration mode, measurement was performed by using a laser Doppler vibrometer (AT7200 manufactured by Graphtec Corporation) to count the number of anti-nodes at which the amount of vibration displacement becomes the maximum value or the minimum value while scanning in the longitudinal direction of the glass plate.

As a result, the impedance became minimum at a frequency of 40 kHz in the in-phase drive so that the 9th vibration mode appeared.

In addition, in the anti-phase drive, the 8th vibration mode became minimum at a frequency of 36 kHz.

In addition, in order to set the sweep rate to be faster than a variation rate of the resonance frequency, the sweep rate was set to have a maximum value in every sweep both in the in-phase drive and in the anti-phase drive.

Because the drive frequency exceeds the resonance frequency, the amount of vibration displacement has a maximum value.

In this example, because the variation rate of the resonance frequency was 1 Hz/sec or higher to 1 kHz/sec or lower, the sweep rate was set to 10 kHz/sec both in the in-phase drive and in the anti-phase drive.

Here, in order to confirm the effect of the foreign substance removing device of this example, there were prepared polypropylene beads having three different diameters of 1 μm, 10 μm, and 100 μm similar to dust particles.

The three types of beads were all adhered to the glass plate, and sweep drive was performed. After that, the number of beads remaining on the glass plate was counted in the image taken by an optical microscope, so as to measure the removal ratio of beads.

On this occasion, in order to check the foreign substance removing performance in low voltage drive, the sweep drive was performed at a drive voltage that was 70% of the normal drive voltage.

The frequency range of the sweep was set to 10 kHz with a center frequency of {(frequency generated in the 8th vibration mode)+(frequency generated in the 9th vibration mode) }/2, and the sweep drive was repeated in in-phase and in anti-phase for a certain period of time.

In this case, using a laser Doppler displacement meter, the amount of vibration displacement at each frequency was measured when the sweep was performed in the in-phase drive at a point where the amount of vibration displacement became maximum near the middle of the glass plate.

As a result, similarly to Example 1, the amount of vibration displacement was increased rapidly in the vicinity of the resonance frequency.

In addition, beyond the resonance frequency, when the drive frequency was swept away from the resonance frequency to high frequency, the amount of vibration displacement was not decreased so much. Therefore, it is understood that the integrated displacement of the amount of vibration displacement in the sweep is increased.

In addition, the amount of vibration displacement in the anti-phase drive had the same tendency.

As a result of measuring the removal ratio of beads, the removal ratio in this example was 95% for 1 μm beads, 97% for 10 μm beads, and 98% for 100 μm beads.

Example 3

Example 3 describes a method of manufacturing a piezoelectric element using a piezoelectric material of a solid solution of bismuth sodium titanate and bismuth potassium titanate as a main component.

In this example, a piezoelectric element using a piezoelectric material expressed by 88(Bi, Na)$TiO_3$-8(Bi, K)$TiO_3$-4$BaTiO_3$ was produced.

Concerning other processes except the producing process of the piezoelectric element, the same processes as in Example 1 were used to manufacture the foreign substance removing device.

However, the powder of particles produced by spray dry was obtained by mixing $Bi_2O_3$, $Na_2CO_3$, $TiO_2$, $BaCO_3$, and $K_2CO_3$ at a desired composition ratio, and by calcining the mixture in an alumina crucible at 850° C. for 5 hours.

In addition, the resultant was sintered at a temperature of 1,100° C. for 2 hours, and in the process, kept at 600° C. for 10 hours.

The piezoelectric element having a size of 33.3×4.0×0.25 mm produced by the process described above was used for manufacturing the foreign substance removing device.

Note that, in this example, density of the piezoelectric material through the above-mentioned sintering was measured by Archimedes' method, and the density was $5.9 \times 10^3$ kg/m$^3$. In addition, Young's modulus was 119 GPa.

Next, in the manufactured foreign substance removing device, in order to know resonance frequencies generated in 8th and 9th vibration modes, variation of the impedance value was measured as follows.

Specifically, variation of the impedance value was measured by using an impedance analyzer when the frequency was changed at a low voltage of 0.5 V in the case of in-phase and in the case of anti-phase with respect to the first electrode and the second electrode.

In addition, in order to know the order of the vibration mode, measurement was performed by using a laser Doppler vibrometer (AT7200 manufactured by Graphtec Corporation) to count the number of anti-nodes at which the amount of vibration displacement becomes the maximum value or the minimum value while scanning in the longitudinal direction of the glass plate.

As a result, the impedance became minimum at a frequency of 43 kHz in the in-phase drive so that the 9th vibration mode appeared.

In addition, in the anti-phase drive, the 8th vibration mode became minimum at a frequency of 38 kHz.

In addition, in order to set the sweep rate to be faster than a variation rate of the resonance frequency, the sweep rate was set to have a maximum value in every sweep both in the in-phase drive and in the anti-phase drive.

Because the drive frequency exceeds the resonance frequency, the amount of vibration displacement has a maximum value.

In this example, because the variation rate of the resonance frequency was 1 Hz/sec or higher to 1 kHz/sec or lower, the sweep rate was set to 10 kHz/sec both in the in-phase drive and in the anti-phase drive.

Here, in order to confirm the effect of the foreign substance removing device of this example, there were prepared polypropylene beads having three different diameters of 1 μm, 10 μm, and 100 μm similar to dust particles.

The three types of beads were all adhered to the glass plate, and sweep drive was performed. After that, the number of beads remaining on the glass plate was counted in the image taken by an optical microscope, to measure the removal ratio of beads.

On this occasion, in order to check the foreign substance removing performance in low voltage drive, the sweep drive was performed at a drive voltage that was 70% of the normal drive voltage.

The frequency range of the sweep was set to 10 kHz with a center frequency of {(frequency generated in the 8th vibration mode)+(frequency generated in the 9th vibration mode)}/2. In this example, the sweep drive was repeated in in-phase and in anti-phase from 99.5 kHz to 119.5 kHz for a certain period of time.

In this case, using a laser Doppler displacement meter, the amount of vibration displacement at each frequency was measured when the sweep was performed in the in-phase drive at a point where the amount of vibration displacement became maximum near the middle of the glass plate.

As a result, similarly to Example 1, the amount of vibration displacement was increased rapidly in the vicinity of the resonance frequency.

In addition, beyond the resonance frequency, when the drive frequency was swept away from the resonance frequency to high frequency, the amount of vibration displacement was not decreased so much. Therefore, it is understood that the integrated displacement of the amount of vibration displacement in the sweep is increased.

In addition, the amount of vibration displacement in the anti-phase drive had the same tendency. As a result of measuring the removal ratio of beads, the removal ratio in this example was 95% for 1 μm beads, 97% for 10 μm beads, and 98% for 100 μm beads.

Example 4

Example 4 describes a method of manufacturing a piezoelectric element using a piezoelectric material of single substance of potassium sodium niobate as a main component.

In this example, a piezoelectric element using a piezoelectric material expressed by $(K, Na)NbO_3$ was produced. Concerning other processes except the producing process of the piezoelectric element, the same processes as in Example 1 were used to manufacture the foreign substance removing device.

However, the powder of particles produced by spray dry was obtained by mixing $Na_2CO_3$, $K_2CO_3$, and $Nb_2O_5$ at a desired composition ratio, and by calcining the mixture in an alumina crucible at 850° C. for 5 hours.

In addition, the resultant was sintered at a temperature of 1,200° C. for 2 hours, and in the process, kept at 600° C. for 10 hours. The piezoelectric material having a size of 33.3×4.0×0.25 mm produced by the process described above was used for manufacturing the foreign substance removing device.

Note that, in this embodiment, density of the piezoelectric material through the above-mentioned sintering was measured by Archimedes' method, and the density was $4.01 \times 10^3$ $kg/m^3$, and a relative density to the theoretical density was 89%. In addition, Young's modulus was 140 GPa.

Next, in the manufactured foreign substance removing device, in order to know resonance frequencies generated in 8th and 9th vibration modes, variation of the impedance value was measured as follows.

Specifically, variation of the impedance value was measured by using an impedance analyzer when the frequency was changed at a low voltage of 0.5 V in the case of in-phase and in the case of anti-phase with respect to the first electrode and the second electrode.

In addition, in order to know the order of the vibration mode, measurement was performed by using a laser Doppler vibrometer (AT7200 manufactured by Graphtec Corporation) to count the number of anti-nodes at which the amount of vibration displacement becomes the maximum value or the minimum value while scanning in the longitudinal direction of the glass plate.

As a result, the impedance became minimum at a frequency of 45 kHz in the in-phase drive so that the 9th vibration mode appeared.

In addition, in the anti-phase drive, the 8th vibration mode became minimum at a frequency of 40 kHz.

In addition, in order to set the sweep rate to be faster than a variation rate of the resonance frequency, the sweep rate was set to have a maximum value in every sweep both in the in-phase drive and in the anti-phase drive.

Because the drive frequency exceeds the resonance frequency, the amount of vibration displacement has a maximum value.

In this example, because the variation rate of the resonance frequency was 1 Hz/sec or higher to 1 kHz/sec or lower, the sweep rate was set to 10 kHz/sec both in the in-phase drive and in the anti-phase drive.

Here, in order to confirm the effect of the foreign substance removing device of this example, there were prepared polypropylene beads having three different diameters of 1 μm, 10 μm, and 100 μm similar to dust particles.

The three types of beads were all adhered to the glass plate, and sweep drive was performed. After that, the number of beads remaining on the glass plate was counted in the image taken by an optical microscope, to measure the removal ratio of beads.

On this occasion, in order to check the foreign substance removing performance in low voltage drive, the sweep drive was performed at a drive voltage that was 70% of the normal drive voltage.

The frequency range of the sweep was set to 10 kHz with a center frequency of {(frequency generated in the 8th vibration mode)+(frequency generated in the 9th vibration mode)}/2, and the sweep drive was repeated in in-phase and in anti-phase for a certain period of time.

In this case, using a laser Doppler displacement meter, the amount of vibration displacement at each frequency was measured when the sweep was performed in the in-phase drive at a point where the amount of vibration displacement became maximum near the middle of the glass plate.

As a result, similarly to Example 1, the amount of vibration displacement was increased rapidly in the vicinity of the resonance frequency.

In addition, beyond the resonance frequency, when the drive frequency was swept away from the resonance frequency to high frequency, the amount of vibration displacement was not decreased so much. Therefore, it is understood that the integrated displacement of the amount of vibration displacement in the sweep is increased.

In addition, the amount of vibration displacement in the anti-phase drive had the same tendency. In addition, the range of variation of the resonance frequency in one sweep was $10^{-5}$ times the frequency range of the sweep.

As a result of measuring the removal ratio of beads, the removal ratio in this example was 87% for 1 μm beads, 87% for 10 μm beads, and 89% for 100 μm beads.

Example 5

Example 5 describes an example in which the foreign substance removing device manufactured in Example 1 was used, and the sweep rate of the drive frequency was set to be slower than a variation of the resonance frequency.

Here, in order to confirm the effect of the foreign substance removing device of this example, there were prepared polypropylene beads having three different diameters of 1 μm, 10 μm, and 100 μm similar to dust particles. The three types of beads were all adhered to the glass plate, and sweep drive was performed. After that, the number of beads remaining on the glass plate was counted in the image taken by an optical microscope, to measure the removal ratio of beads.

On this occasion, in order to check the foreign substance removing performance in low voltage drive, the sweep drive was performed at a drive voltage that was 70% of the normal drive voltage.

The frequency range of the sweep was set to 10 kHz with a center frequency of {(frequency generated in the 8th vibration mode)+(frequency generated in the 9th vibration mode)}/2, and the sweep drive was repeated in in-phase and in anti-phase for a certain period of time.

In addition, in order that the sweep rate be slower than the variation rate of the resonance frequency, the sweep rate was set to have no maximum value in every sweep both in the in-phase drive and in the anti-phase drive.

In this case, using a laser Doppler displacement meter, the amount of vibration displacement at each frequency was measured when the sweep was performed in the in-phase drive at a point where the amount of vibration displacement became maximum near the middle of the glass plate.

As a result, the amount of vibration displacement kept the high amount of vibration displacement without having a maximum value, and the integrated displacement of the amount of vibration displacement in the sweep was increased. In addition, the amount of vibration displacement when driving in anti-phase had the same tendency.

As a result of measuring the removal ratio of beads, the removal ratio in this example was 85% for 1 μm beads, 85% for 10 μm beads, and 86% for 100 μm beads.

Comparative Example 1

Next, Comparative Examples are described.

As Comparative Example 1, lead titanate zirconate was used as the piezoelectric material, and the foreign substance removing device was manufactured using the piezoelectric element on which the polarization process had been already performed.

Other than the above-mentioned piezoelectric element, the same method as in Example 1 was used to manufacture the foreign substance removing device.

Further, in this comparative example, density of the piezoelectric material was measured by Archimedes' method, and the density was $7.5 \times 10^3$ kg/m$^3$, and Young's modulus was 66 GPa. Here, in order to know resonance frequencies generated in the 8th and 9th vibration modes of the foreign substance removing device, frequency response was measured by using the impedance analyzer at a low voltage of 0.5 V in each case of in-phase and anti-phase with respect to the first electrode and the second electrode.

In addition, in order to know the order of the vibration mode, the measurement was performed by using a laser Doppler vibrometer to count the number of anti-nodes at which the amount of vibration displacement became the maximum value or the minimum value while scanning in the longitudinal direction of the glass plate.

As a result, the impedance became minimum at a frequency of 35 kHz in the in-phase drive so that the 9th vibration mode appeared.

In addition, in the anti-phase drive, the 8th vibration mode became minimum at a frequency of 30 kHz.

Here, in order to confirm the performance of the foreign substance removing device of this comparative example, there were prepared polypropylene beads having three different diameters of 1 μm, 10 μm, and 100 μm similar to dust particles.

The three types of beads were all adhered to the glass plate, and sweep drive was performed. After that, the number of beads remaining on the glass plate was counted in the image taken by an optical microscope, to measure the removal ratio of beads.

On this occasion, in order to check the foreign substance removing performance in low voltage drive, the sweep drive was performed at a drive voltage that was 70% of the normal drive voltage.

The frequency range of the sweep was set to 10 kHz with a center frequency of {(frequency generated in the 8th vibration mode)+(frequency generated in the 9th vibration mode)}/2, and the sweep drive was repeated in in-phase and in anti-phase for a certain period of time.

In addition, the variation rate of the resonance frequency in this comparative example was −1 kHz/sec or higher to −1 Hz/sec or lower. The sweep rate was set to 10 kHz/sec both in the in-phase drive and in the anti-phase drive.

In this case, the amount of vibration displacement at each frequency was measured by the laser Doppler displacement meter when the sweep was performed in the in-phase drive at the point where the amount of vibration displacement became maximum near the middle of the glass plate.

Compared with the results of Examples 1 to 5, the integrated amount of displacement was small.

In this comparative example, the removal ratio of beads was 75% for 1 μm beads, 75% for 10 μm beads, and 75% for 100 μm beads.

Comparative Example 2

In Comparative Example 2, the drive frequency was swept in the same method as in the above-mentioned Comparative Example 1, but from low frequency to high frequency. In this case, in order to check the foreign substance removing performance in the low voltage drive, the sweep drive was performed at a drive voltage that was 70% of the normal drive voltage.

In addition, the variation rate of the resonance frequency in this comparative example was −1 kHz/sec or higher to −1 Hz/sec or lower. The sweep rate was set to 10 kHz/sec both in the in-phase drive and in the anti-phase drive.

In this case, the amount of vibration displacement at each frequency was measured by the laser Doppler displacement meter when the sweep was performed in the in-phase drive at the point where the amount of vibration displacement became maximum near the middle of the glass plate.

As a result, compared with the results of Examples 1 to 5, the integrated amount of displacement was small.

In this comparative example, the removal ratio of beads was 72% for 1 μm beads, 71% for 10 μm beads, and 72% for 100 μm beads.

Comparative Example 3

In Comparative Example 3, the drive frequency was swept in the same method as in the above-mentioned Comparative Example 1, but the sweep direction is from high frequency to low frequency.

In this case, the amount of vibration displacement at each frequency was measured by the laser Doppler displacement meter when the sweep was performed in the in-phase drive at the point where the amount of vibration displacement became maximum near the middle of the glass plate.

Figure 5:
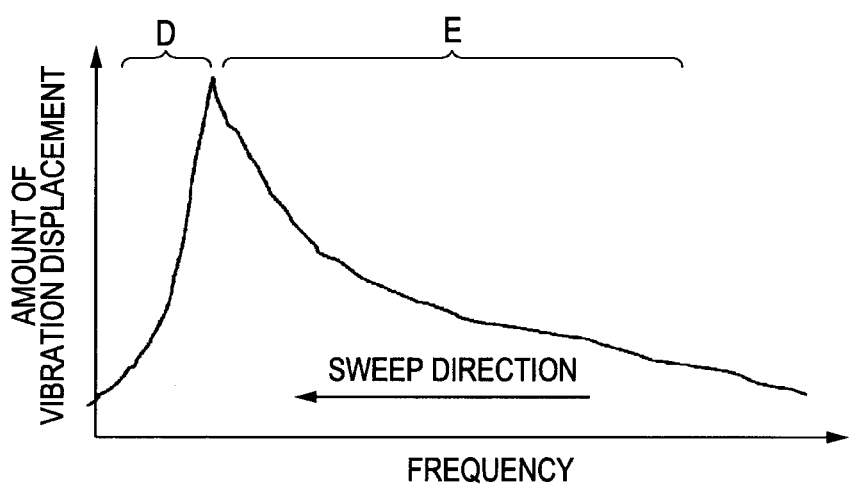
FIG. 5 is a graph illustrating vibrations at individual frequencies in the foreign substance removing device according to Comparative Example 3.

A schematic diagram showing the result is illustrated in FIG. 5.

When the drive frequency was swept, the amount of vibration displacement was decreased rapidly at a vicinity of the resonance frequency (in region D in the diagram).

In addition, compared with the results of Examples 1 to 5, the amount of vibration displacement was small on the higher frequency side than the resonance frequency (in region E in the diagram). As a result, the integrated vibration amount in the sweep was also small. In addition, the amount of vibration displacement when driving in anti-phase had the same tendency.

In this comparative example, the removal ratio of beads was 72% for 1 μm beads, 72% for 10 μm beads, and 73% for 100 μm beads.

The results of experiment are shown in Table 1.

TABLE 1

|  | Example 1 | Example 2 | Example 3 | Example 4 | Example 5 | Comparative Example 1 | Comparative Example 2 | Comparative Example 3 |
| --- | --- | --- | --- | --- | --- | --- | --- | --- |
| 1 μm beads removal ratio (%) | 96 | 95 | 95 | 87 | 85 | 75 | 72 | 72 |
| 10 μm beads removal ratio (%) | 98 | 97 | 97 | 87 | 85 | 75 | 71 | 72 |
| 100 μm beads removal ratio (%) | 99 | 98 | 98 | 89 | 86 | 75 | 72 | 73 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-177526, filed Aug. 6, 2010, which is hereby incorporated by reference herein in its entirety.

What is claimed is:

1. A vibration generating device, comprising:
a piezoelectric element including a piezoelectric material that contains Pb at 1,000 ppm or lower interposed between electrodes, the piezoelectric material having a resonance frequency that changes to a higher frequency side when an alternating voltage is applied;
a vibration member to which the piezoelectric element is connected;
a power source for applying the alternating voltage to the piezoelectric element; and
a control section for controlling a frequency of the alternating voltage applied by the power source,
wherein the vibration generating device generates vibration in the vibration member by applying the alternating voltage to the piezoelectric element from the power source,
wherein the control section controls the frequency of the alternating voltage applied to the piezoelectric element so that the frequency of the alternating voltage applied to the piezoelectric element is successively changed from a low frequency side to a high frequency side in a frequency range including a change range of a resonance frequency of the piezoelectric element, and
wherein the control section controls the frequency of the alternating voltage applied to the piezoelectric element so that a change rate of the frequency of the alternating voltage is set larger than a change rate of the resonance frequency of the piezoelectric element.

2. The vibration generating device according to claim 1, wherein the piezoelectric material contains, as a main component, one or more solid solutions selected from the group consisting of barium titanate, bismuth sodium titanate, bismuth potassium titanate, and potassium sodium niobate.

3. A foreign substance removing device comprising the vibration generating device according to claim 1, wherein the foreign substance removing device removes foreign substances by vibration generated by the vibration generating device.

4. An optical device comprising the foreign substance removing device according to claim 3, wherein the foreign substance removing device removes foreign substances on an optical path.

5. A method of driving a vibration generating device, the vibration generating device comprising a piezoelectric element including a piezoelectric material that contains Pb at 1,000 ppm or lower interposed between electrodes, the piezoelectric material having a resonance frequency that changes to a higher frequency side when an alternating voltage is applied;
a vibration member to which the piezoelectric element is connected;
a power source for applying the alternating voltage to the piezoelectric element; and
a control section for controlling a frequency of the alternating voltage applied by the power source,
wherein the vibration generating device generates vibration in the vibration member by applying the alternating voltage to the piezoelectric element from the power source, and
wherein the control section controls the frequency of the alternating voltage applied to the piezoelectric element so that the resonance frequency of the piezoelectric element is successively changed from a low frequency side to a high frequency side in a frequency range including a change range of a resonance frequency of the piezoelectric element, the method comprising:

setting a change rate of the frequency of the alternating voltage to be larger than a change rate of the resonance frequency of the piezoelectric element.

* * * * *